United States Patent [19]

Sakamoto et al.

[11] Patent Number: 4,514,782
[45] Date of Patent: Apr. 30, 1985

[54] MULTIPLE FEEDTHROUGH-CAPACITOR UNIT

[75] Inventors: Yukio Sakamoto; Takeshi Tanabe, both of Takefu, Japan

[73] Assignee: Murata Manufacturing Co., Ltd., Japan

[21] Appl. No.: 557,853

[22] Filed: Dec. 5, 1983

[30] Foreign Application Priority Data

Mar. 1, 1983 [JP] Japan .............................. 58-29946[U]

[51] Int. Cl.³ .......................... H01G 1/14; H01R 9/00
[52] U.S. Cl. ..................................... 361/306; 361/404
[58] Field of Search ....................... 361/306, 307, 404

[56] References Cited

U.S. PATENT DOCUMENTS

| | | | |
|---|---|---|---|
| 2,492,742 | 12/1949 | Grasheim | 361/306 X |
| 2,987,800 | 6/1961 | Kurland et al. | 361/306 X |
| 3,059,152 | 10/1962 | Khouri | 361/404 |
| 3,808,478 | 4/1974 | Winkler | 361/307 X |
| 4,314,213 | 2/1982 | Wakino | 361/307 X |

Primary Examiner—Donald A. Griffin
Attorney, Agent, or Firm—Ostrolenk, Faber, Gerb & Soffen

[57] ABSTRACT

A feedthrough-capacitor unit provided with a plurality of feedthrough-capacitors, including a plate made of synthetic resin, a plurality of projections which are provided on one face of the plate and are each formed with each of a plurality of first through-holes, a plurality of terminals which are mounted on the plate so as to extend through the first through-holes, respectively and a plurality of capacitor bodies which are each formed with each of a plurality of second through-holes such that the projections are, respectively, fitted into the second through-holes.

10 Claims, 20 Drawing Figures

MULTIPLE FEEDTHROUGH-CAPACITOR UNIT

BACKGROUND OF THE INVENTION

The present invention generally relates to capacitors and more particularly, to a multiple feedthrough-capacitor unit provided with a plurality of feedthrough-capacitors, which is used as a noise filter for various electrical circuits.

Conventionally, in feedthrough-capacitors to be used as noise filters, it has been generally so arranged that inner and outer electrodes are, respectively, provided on inner and outer peripheral surfaces of each of cylindrical capacitor bodies made of ceramics, etc. such that the inner and outer electrodes are, respectively, connected, through solder, to a feedthrough-terminal extending through each of the capacitor bodies and a grounding terminal. Meanwhile, in electric appliances such as tuners of television sets, stereo receivers, etc., a plurality of the feedthrough-capacitors of the above described type are used at a time in some cases, in which cases it is desirable to form the plurality of the feedthrough-capacitors into a unitary member from the standpoint of saving of space required therefor.

Conventionally, in a multiple feedthrough-capacitor unit provided with a plurality of the feedthrough-capacitors, it has been so arranged that capacitor bodies are sequentially, respectively, fitted into through-holes provided, at a predetermined interval, on a metallic substrate and feedthrough-terminals are, respectively, inserted through through-openings each provided on each of the capacitor bodies such that the capacitor bodies are soldered to the metallic substrate and the feedthrough-terminals.

However, the known multiple feedthrough-capacitor unit has such inconveniences that a jig for positioning, at an accurate interval, the capacitor bodies soldered to the metallic substrate and a jig for bringing the feedthrough-terminals into alignment with the capacitor bodies, respectively are required to be provided.

Moreover, the known multiple feedthrough-capacitor unit has such disadvantages that it is extremely troublesome to solder the capacitor bodies to the metallic substrate through positioning of the capacitor bodies by the use of such jigs and it is difficult to perform automatic assembly of the known multiple feedthrough-capacitor unit, thereby resulting in increase in cost of assembly thereof.

Meanwhile, in the case where ceramics is used as dielectric of the capacitor bodies, the known multiple feedthrough-capacitor unit has been disadvantageous in that, when a soldering bit is brought into direct contact with the dielectric at the time of soldering of the feedthrough-terminals, the dielectric may be cracked by the thermal impulse.

Figure 1:
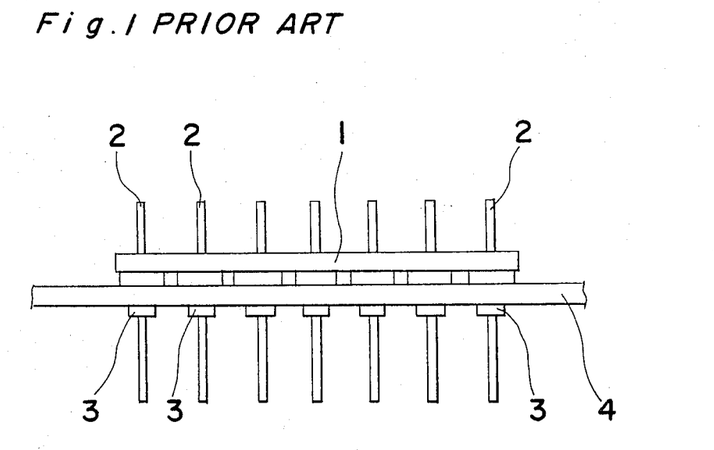
FIG. 1 is a front elevational view of a prior art multiple feedthrough-capacitor unit (already referred to)

Furthermore, conventionally, in another multiple feedthrough-capacitor unit, it has been so arranged as shown in FIG. 1 that, at the time of molding of a plate 1 made of electrically insulative synthetic resin, a plurality of feedthrough-terminals 2 are vertically insert molded, at a predetermined interval, into the plate 1, while a plurality of inner electrodes (not shown) each provided on an inner peripheral surface of each of capacitor bodies 3 are, respectively, soldered to the feedthrough-terminals 2. In the case where the prior art multiple feedthrough-capacitor unit is mounted on a grounding terminal strip 4, it has been so arranged that the capacitor bodies 3 are fitted into through-holes (not shown) provided, at the predetermined interval, on the grounding terminal strip 4, while a plurality of outer electrodes (not shown) each provided on an outer peripheral surface of each of the capacitor bodies 3 are, respectively, soldered to the grounding terminal strip 4 by dip soldering.

However, the prior art multiple feedthrough-capacitor unit has such inconveniences that, since the plate 1 is not secured to the grounding terminal strip 4, the grounding terminal strip 4 is caused to slip off the capacitor bodies 3 or is removed from the capacitor bodies 3 prior to curing of solder of the dip soldering.

Moreover, the prior art multiple feedthrough-capacitor unit has such a disadvantage that solder for bonding each of the inner electrodes to each of the feedthrough-terminals 2 is molten again by heat due to the dip soldering with the result that the capacitor bodies 3 are caused to slip off the feedthrough-terminals 2, respectively.

SUMMARY OF THE INVENTION

Accordingly, an essential object of the present invention is to provide an improved multiple feedthrough-capacitor unit provided with a plurality of feedthrough-capacitors, in which feedthrough-terminals are accurately mounted, at a predetermined interval, on a plate made of synthetic resin and capacitor bodies are excellent in heat resistance, thus preventing cracking of the capacitor bodies, with substantial elimination of disadvantages inherent in conventional multiple feedthrough-capacitor units of this kind.

Another important object of the present invention is to provide an improved multiple feedthrough-capacitor unit of the above described type in which the feedthrough-capacitors can be accurately and easily mounted on a grounding terminal strip.

Still another object of the present invention is to provide an improved multiple feedthrough-capacitor unit of the above described type which is simple in structure, highly reliable in actual use and suitable for mass production at low cost.

In accomplishing these and other objects according to one preferred embodiment of the present invention, there is provided an improved multiple feedthrough-capacitor unit provided with a plurality of feedthrough-capacitors, comprising: a plate made of synthetic resin; a plurality of projections which are provided on one face of said plate and are each formed with each of a plurality of first through-holes extending through both a corresponding one of said projections concentrically therewith and said plate, respectively; a plurality of terminals which are mounted on said plate so as to extend through said first through-holes, respectively; and a plurality of capacitor bodies each provided in each of said feedthrough-capacitors, which are each formed with each of a plurality of second through-holes such that said projections are, respectively, fitted into said second through-holes, whereby said feedthrough-capacitors are mounted on said plate.

In accordance with the present invention, the feedthrough-terminals can be accurately mounted, at a predetermined terminal, on the plate made of synthetic resin.

Furthermore, in accordance with the present invention, the feedthrough-capacitors can be accurately and easily mounted on the grounding terminal strip.

BRIEF DESCRIPTION OF THE DRAWINGS

These and other objects and features of the present invention will become apparent from the following description taken in conjunction with the preferred embodiment thereof with reference to the accompanying drawings, in which.

Before the description of the present invention proceeds, it is to be noted that like parts are designated by like reference numerals throughout several views of the accompanying drawings.

DETAILED DESCRIPTION OF THE INVENTION

Referring now to the drawings, there is shown in FIGS. 2 to 5, a multiple feedthrough-capacitor unit K1 according to a first embodiment of the present invention. The unit K1 includes a plurality of feedthrough-capacitors 22, an elongated plate 11 made of heat resistant synthetic resin and a plurality of terminals 12. The plate 11 has a plurality of projections 13 integrally formed, at a substantially predetermined interval, on one face thereof. Each of the projections 13 is formed with a through-hole 19 of a circular shape extending through each of the projections 13 concentrically therewith and the plate 11 such that each of the terminals 12 extends through the through-hole 19.

In order to secure the terminals 12 to the plate 1, it can be so arranged that the through-holes 19 are formed, at a predetermined interval, on the plate 11 and then, the terminals 12 are, respectively, fitted into the through-holes 19. It can be alternatively so arranged that the terminals 12 are insert molded into the plate 1 at the time of molding of the plate 11. When forming of the through-holes 19 and insert molding of the terminals 12 are performed accurately at a predetermined interval in both cases, respectively, an interval between adjacent ones of the terminals 12 can be made accurate.

Figure 4:
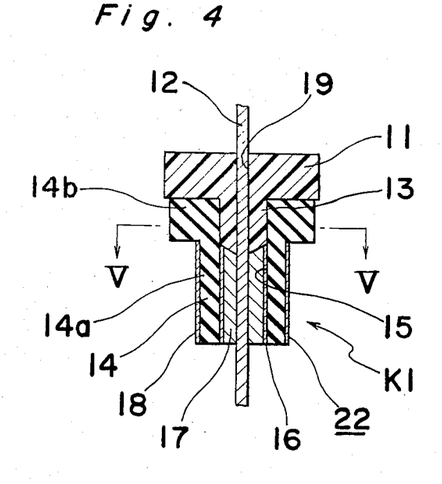
FIG. 4 is an enlarged vertical sectional view of a main portion of the unit of FIG. 2.

As shown in FIG. 4, each of the feedthrough-capacitors 22 includes a capacitor body 14 of a stepped cylindrical shape formed with a through-opening 15, an inner electrode 16 and an outer electrode 18. The capacitor body 14 includes a sleeve portion 14a and a base portion 14b having an outside diameter larger than that of the sleeve portion 14a such that the inner electrode 16 is fitted into the through-opening 15, while the outer electrode 18 is fitted around an outer peripheral surface of the sleeve portion 14a. Each of the projections 13 is pressed into the through-opening 15 of the capacitor body 14 through utilization of elasticity of synthetic resin as the material of the projections 13 so as to be secured therein, so that the plate 11 is coupled with the capacitor body 14, with the base portion 14b being pressed onto the plate 11.

Since each of the through-holes 19 is formed concentrically with each of the projections 13, each of the terminals 12 extends through the capacitor body 14 at an axis thereof. Consequently, each of the terminals 12 is connected to the inner electrode 16 through solder 17 filled inside the inner electrode 16, while the outer electrode 18 is connected to a grounding terminal strip such as a chassis, etc.

Figure 2:
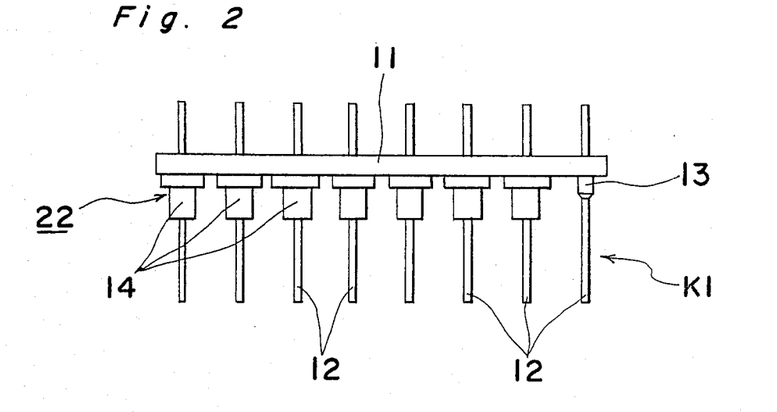
FIG. 2 is a front elevational view of a multiple feedthrough-capacitor unit according to a first embodiment of the present invention.
Figure 3:
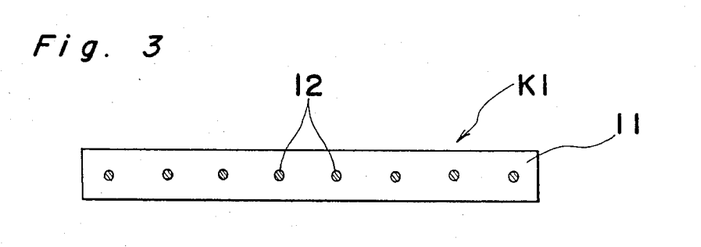
FIG. 3 is a top plan view of the unit of FIG. 2.

Meanwhile, in the case where noise is not required to be eliminated from any of the terminals 12, there is no need for mounting the feedthrough-capacitor 22 on the terminal 12 as shown in the right end portion of FIG. 2.

In order to secure each of the projections 13 of the plate 11 in the through-opening 15 of the capacitor body 14, each of the projections 13 and the through-opening 15 can be formed into various cross-sectional shapes. However, in the case where a contact area between each of the projections 13 and the through-opening 15 is large, a resisting force against insertion of each of the projections 13 into the through-opening 15 becomes large, so that it becomes difficult to insert each of the projections 13 into the through-opening 15.

Namely, in the case where both each of the projections 13 and the through-opening 15 are of a circular or angular cross section, a whole outer peripheral surface of each of the projections 13 is brought into contact with a whole inner peripheral surface of the through-opening 15, so that a resisting force against insertion of each of the projections 13 into the through-opening 15 becomes large. Accordingly, when each of the projections 13 is forcibly pressed into the through-opening 15, the capacitor body 14 may be cracked and thus, dimensional errors between each of the projections 13 and the through-opening 15 are required to be made small.

Figure 5:
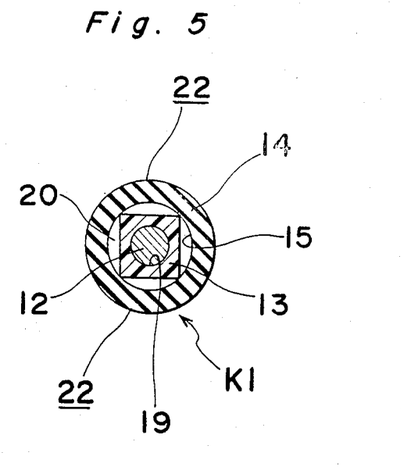
FIG. 5 is a horizontal sectional view taken along the line V—V in FIG. 4.

Thus, in the case where each of the projections 13 and the through-opening 15 are, respectively, so formed as to have a cross-section of a polygonal shape such as a triangular or rectangular one and a cross-section of a circular shape as shown in FIG. 5 such that each of the projections 15 is brought into line contact with the through-opening 15 at a plurality of lines thereof or into point contact with the through-opening 15 at a plurality of points thereof, a resisting force against insertion of each of the projections 13 into the through-opening 15 becomes small. Moreover, since a space 20 is defined between sides of each of the projections 13 and a periphery of the through-opening 15 so as to allow each of the projections 13 to be deformed thereinto, the capacitor body 14 can be prevented from being cracked.

Figure 6:
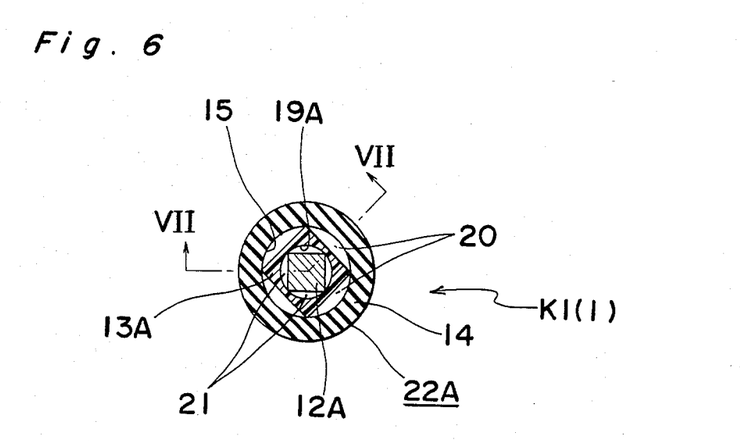
FIG. 6 is a view similar to FIG. 5, particularly showing a first modification thereof.
Figure 7:
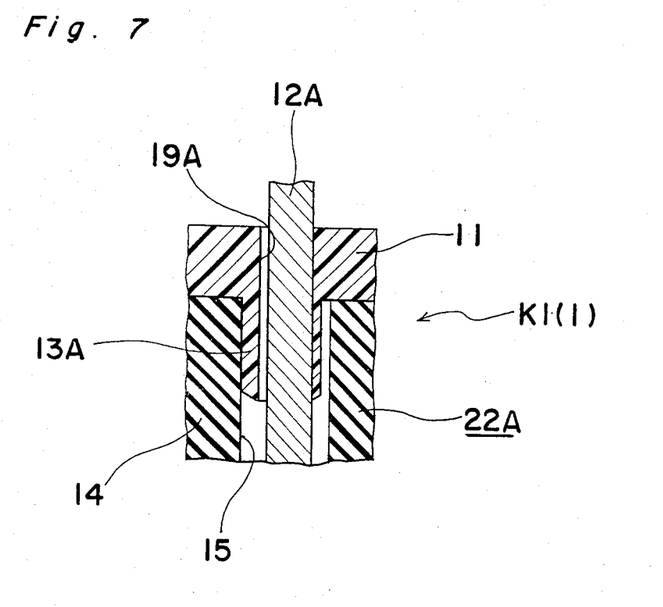
FIG. 7 is a vertical sectional view taken along the line VII—VII in FIG. 6.

Referring now to FIGS. 6 and 7, there is shown a multiple feedthrough-capacitor unit K1(1) which is a first modification of the unit K1. The first modified unit K1(1) includes a plurality of feedthrough-capacitors 22A. Meanwhile, the terminals 12 and the projections 13 of the unit K1 are, respectively, replaced by terminals 12A and projections 13A. In the first modified unit K1(1), the through-opening 15 is formed into a circular cross-sectional shape and each of the projections 13A is formed into a rectangular cross-sectional shape corresponding to the through-opening 15 such that the space 20 is defined between the sides of each of the projections 13 and the periphery of the through-opening 15 as in the case of the unit K1. Furthermore, in the first modified unit K1(1), each of the terminals 12A is so formed as to have a cross section of an angular shape such as a rectangular shape as shown and a through-hole 19A of each of the projections 13 is formed into a circular cross-sectional shape corresponding to each of the terminals 12A such that a space 21 is defined between sides of each of the terminals 12A and a periphery of the through-hole 19A.

By the above described arrangement of the first modified unit K1(1), when each of the terminals 12A and each of the projections 13A are, respectively, fitted into the through-hole 19A of each of the projections 13A and the through-opening 15 of the capacitor body 14, each of the projections 13A is allowed to be deformed into the spaces 20 and 21, so that each of the terminals 12A and each of the projections 13A can be easily fitted into and fixedly secured in the through-hole 19A and the through-opening 15, respectively through full utilization of elasticity of synthetic resin as the material of the projections 13A. Since other constructions of the modified unit K1(1) are similar to those of the unit K1, detailed description thereof is abbreviated for the sake of brevity.

Meanwhile, since such a phenomenon sometimes takes place that corners of each of the terminals 12A form different interior angles with respect to the through-hole 19A of a circular shape, it can be alternatively so arranged that the through-hole 19A is formed into an octagonal shape or grooves for receiving the corners of each of the terminals 12A therein are formed on a periphery of the through-hole 19A so as to position each of the terminals 12A with respect to the through-hole 19A.

Figure 8:
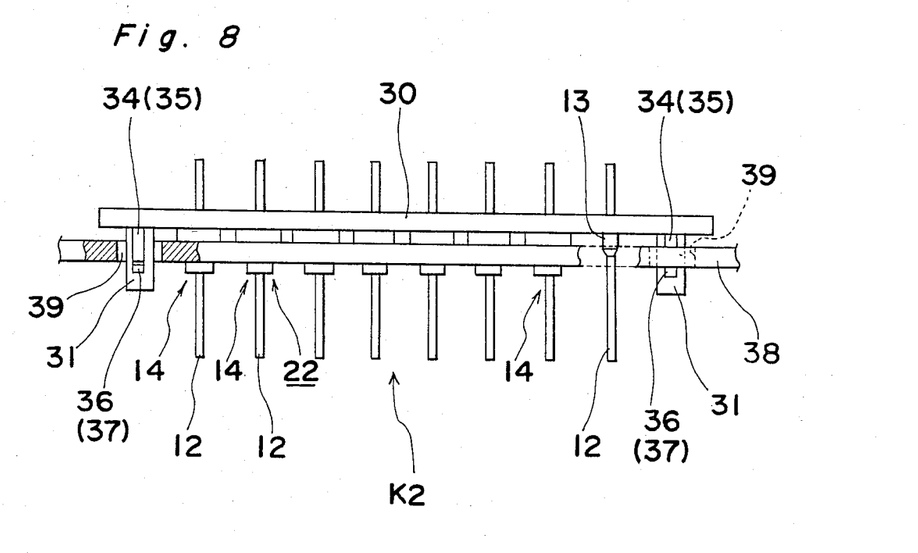
FIG. 8 is a front elevational view of a multiple feedthrough-capacitor unit according to a second embodiment of the present invention.
Figure 9:
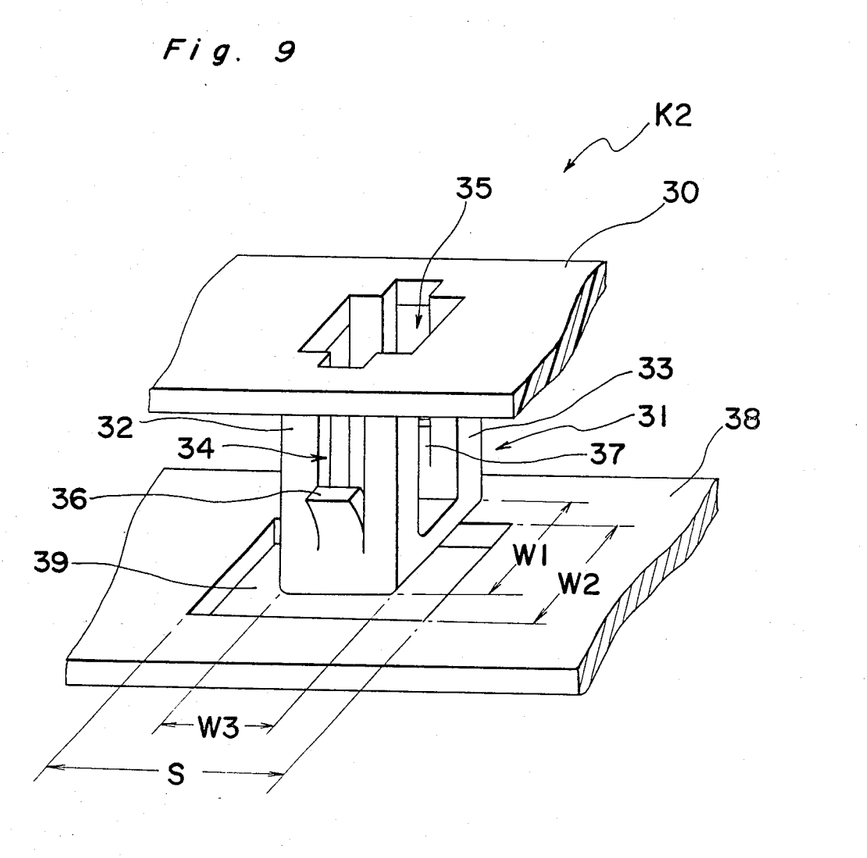
FIG. 9 is an enlarged exploded perspective view of a portion of the unit of FIG. 8.

Referring to FIGS. 8 and 9, there is shown a multiple feedthrough-capacitor unit K2 according to a second embodiment of the present invention. The unit K2 includes an elongated plate 30 made of heat resistant synthetic resin and a grounding terminal strip 38. The plate 30 has a pair of fixing protrusions 31 extending from one face thereof, on which face a plurality of the projections 13 are formed.

As best shown in FIG. 9, each of the fixing protrusions 31 is of a substantially U-shaped vertical cross section extending in a widthwise direction of the plate 30. Each of the fixing protrusions 31 has a pair of side walls 32 and 33 extending in a lengthwise direction of the plate 30. The side walls 32 and 33 have slots 34 and 35 of a predetermined width formed at central portions thereof, respectively. The side walls 32 and 33 further have engaging pieces 36 and 37 formed at distal ends of the slots 34 and 35, respectively such that the engaging pieces 36 and 37 extend upwardly and obliquely from the distal ends of the slots 34 and 35 in directions remote from each other, respectively.

On the other hand, the grounding terminal strip 38 to be electrically connected to the outer electrodes 18 of the feedthrough-capacitors 22 is formed with a pair of openings 39 of a rectangular shape for receiving the fixing protrusions 31 therein, respectively. Each of openings 39 has a width W2 substantially equal to a length W1 between an outer face of the side wall 32 and that of the side wall 33 and a length S preferably larger than a width W3 of each of the fixing protrusions 31.

In order to mount the plate 30 of the above described construction on the grounding terminal strip 38, the capacitor bodies 14 are preliminarily attached to the plate 30 and then, the fixing protrusions 31 of the plate 30 are, respectively, pressed into the openings 39 of the grounding terminal strip 38, so that the engaging pieces 36 and 37 of each of the fixing protrusions 31 are retained at peripheral edges of each of the openings 39, whereby the plate 30 is secured to the grounding terminal strip 38.

Subsequently, when a whole structure of the unit K2 is subjected to dip soldering, the grounding terminal strip 38 is soldered to the outer electrodes 18, while the inner electrodes 16 are soldered to the terminals 12 by the solder 17. Thus, since the plate 30 is secured to the grounding terminal strip 38, the plate 30 is fixed at a predetermined position of the grounding terminal strip 38 even if the whole structure of the unit K2 is placed in any orientation before the solder 17 is cured in the dip soldering.

Meanwhile, even if the plate 30 or the grounding terminal strip 38 is subjected to thermal expansion by heat of the dip soldering or dimensional errors between the plate 30 and the grounding terminal strip 38 are produced, such expansion and dimensional errors are absorbed by each of the openings 39 having the length S larger than the width W3 of each of the fixing protrusions 31, so that it becomes possible to prevent warpage or deformation of the plate 30. Since other constructions of the unit K2 are similar to those of the unit K1, detailed description thereof is abbreviated for the sake of brevity.

Referring now to FIGS. 10(a) and 10(b), FIGS. 11(a) and 11(b), and FIG. 12, there are shown multiple feedthrough-capacitor units K2(1), K2(2) and K2(3) which are first, second and third modifications of the unit K2, respectively.

Figure 10A:
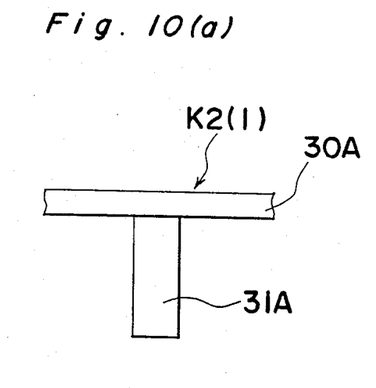
FIGS. 10(a) and 10(b), FIGS. 11(a) and 11(b), FIG. 12 and FIG. 13 are views similar to FIG. 9, particularly showing first, second, third and fourth modifications thereof, respectively.
Figure 10B:
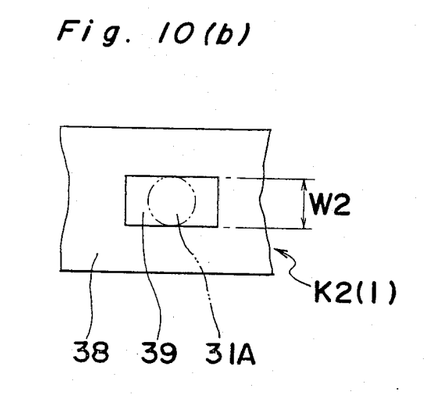

As shown in FIGS. 10(a) and 10(b), the first modified unit K2(1) includes a plate 30A formed with a pair of cylindrical fixing protrusions 31A each having a diameter slightly larger than the width W2 of each of the openings 39.

Figure 11A:
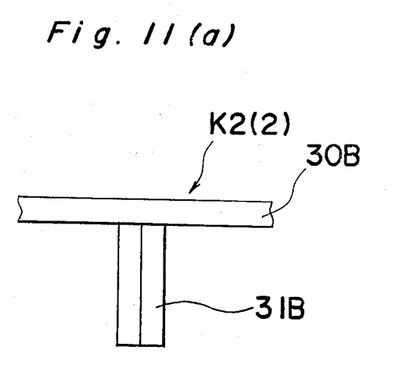
Figure 11B:
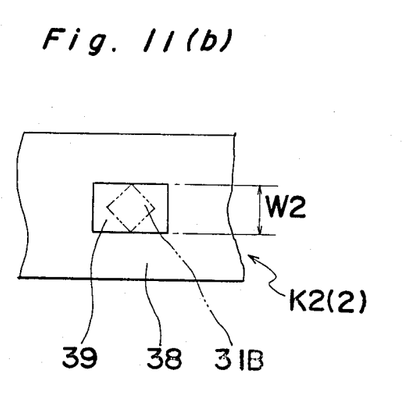

As shown in FIGS. 11(a) and 11(b), the second modified unit K2(2) includes a plate 30B formed with a pair of rectangular fixing protrusions 31B each having a diagonal slightly larger than the width W2 of each of the openings 39.

Figure 12:
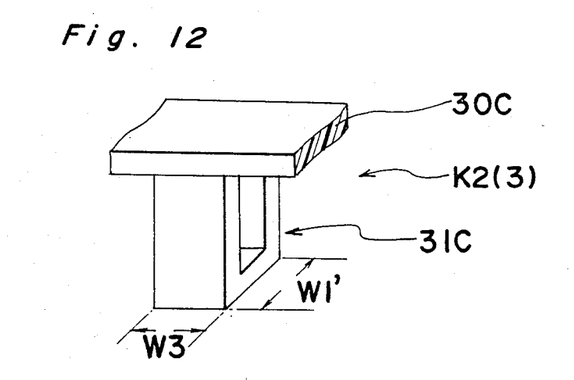

Referring to FIG. 12, the third modified unit K2(3) includes a plate 30C formed with a pair of rectangular fixing protrusions 31C. Each of the fixing protrusions 31C has such a length W1' as to allow each of the fixing protrusions 31C to be pressed into each of the openings 39. Thus, the engaging pieces 36 and 37 of the unit K2 are omitted in the third modified unit K2(3).

Figure 13:
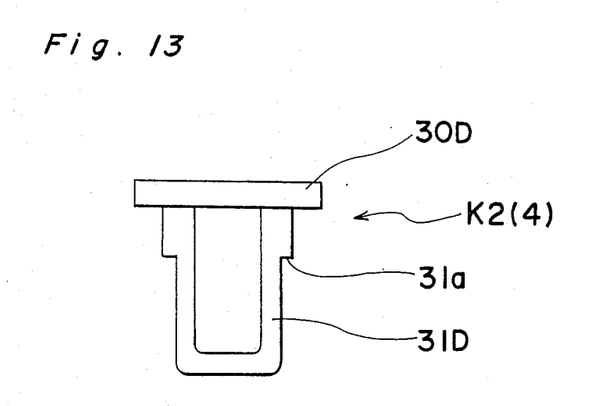
Figure 14:
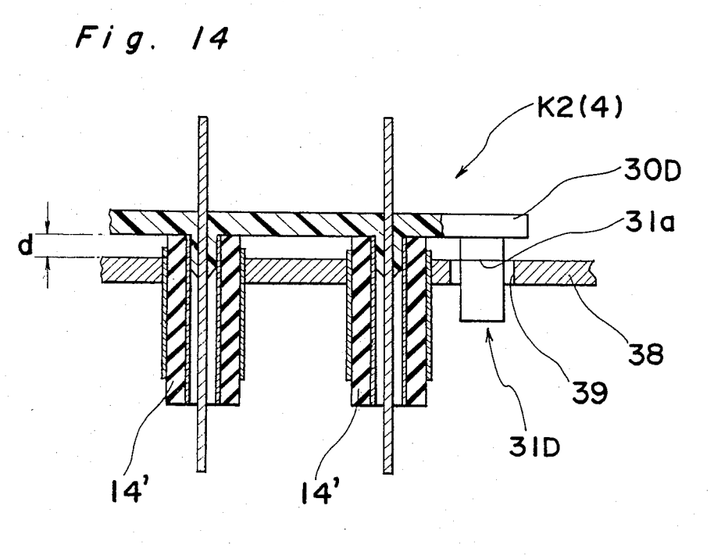
FIG. 14 is a fragmentary vertical sectional view of a multiple feedthrough-capacitor unit employing the portion shown in FIG. 13.
Figure 15:
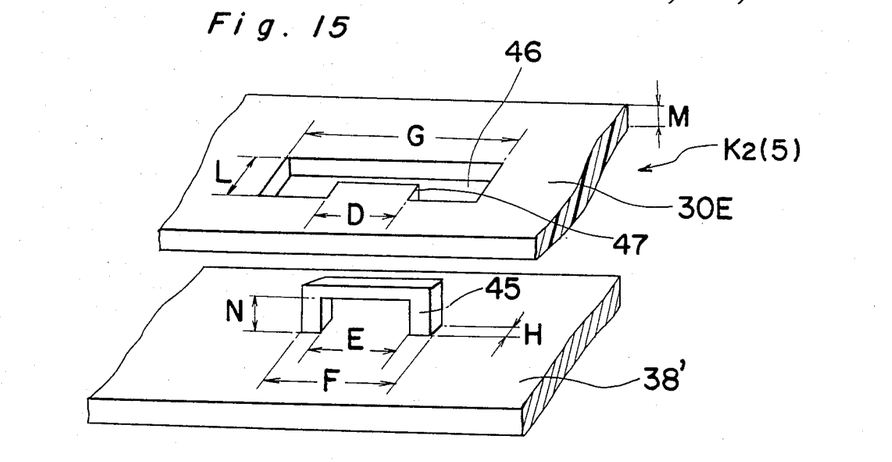
FIG. 15 is a view similar to FIG. 9, particularly showing a fifth modification thereof.
Figure 16:
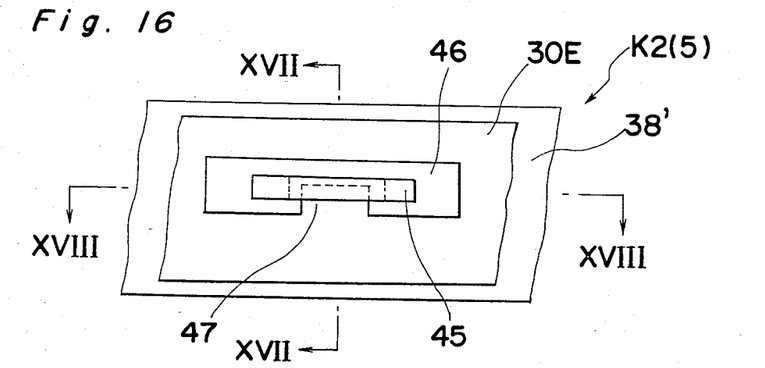
FIG. 16 is a fragmentary top plan view of the unit of FIG. 15.
Figure 17:
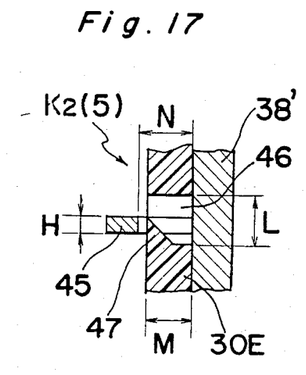
FIG. 17 is a vertical sectional view taken along the line XVII—XVII in FIG. 16.
Figure 18:
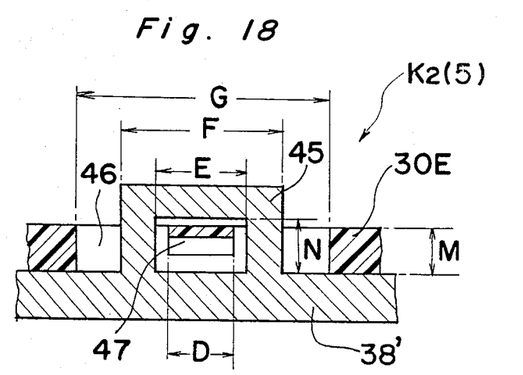
FIG. 18 is a vertical sectional view taken along the line XVIII—XVIII in FIG. 16.

Referring now to FIGS. 13 and 14, there is shown a multiple feedthrough-capacitor unit K2(4) which is a fourth modification of the unit K2. The fourth modified unit K2(4) includes a plate 30D formed with a pair of rectangular fixing protrusions 31D. Each of the fixing protrusions 31D has a stepped portion 31a such that a distance between the plate 30D and the grounding terminal strip 38 is regulated into a predetermined dimension d as shown in FIG. 14. By the above described arrangement of the fourth modified unit K2(4), capacitor bodies 14' thereof may be simply formed into a cylindrical shape unlike the capacitor bodies 14 having the stepped cylindrical shape in the units K1, K1(1), K2 and K2(1) to K2(4).

Referring further to FIGS. 15 to 18, there is shown a multiple feedthrough-capacitor unit K2(5) which is a fifth modification of the unit K2. The fifth modified unit K2(5) includes a plate 30E of a thickness M and a grounding terminal strip 38'. The grounding terminal strip 38' is formed with a pair of U-shaped fixing protrusions 45 confronting the plate 30E. Meanwhile, the plate 30E is formed with a pair of openings 46 of a rectangular shape for receiving the fixing protrusions 45 therein, respectively. A retaining projection 47 of a triangular cross section for retaining each of the fixing protrusions 45 in each of the openings 46 is formed at a central edge portion of each of the openings 46 so as to be flush with an upper face of the plate 30E. More specifically, each of the fixing protrusions 45 has an inner length E, an outer length F, a width H and an inner height N, while each of the openings 46 has a length G and a width L, with the retaining projection 47 having a length D. Since the inner length E, the outer length F and the inner height N of each of the fixing protrusions 45 are, respectively, set to be larger than the length D of the retaining projection 47, smaller than the length G of each of the openings 46 and larger than the thickness M of the plate 30E, thermal expansion of the plate 30E and the grounding terminal strip 38' at the time of soldering thereof can be absorbed by the openings 46.

Furthermore, since the width L of each of the openings 46 is set to be larger than the width H of each of the fixing protrusions 45, the fixing protrusions 45 can be smoothly inserted into the openings 46, respectively.

Since other constructions of the first, second, third, fourth and fifth modified units K2(1) to K2(5) are similar to those of the unit K1, detailed description thereof is abbreviated for the sake of brevity.

As is clear from the foregoing description, firstly, in accordance with the present invention, since a plurality of the terminals are mounted on the plate made of synthetic resin so as to extend through said plate and a plurality of projections are formed on one face of the plate so as to receive therein the terminals concentrically with the terminals, respectively such that the terminals are, respectively, fitted into the feedthrough-capacitors, the positions of the terminals are determined by the plate, so that the interval between adjacent ones of the terminals is set remarkably accurately and there is no need for modifications of the terminals at the time of mounting of the terminals on the plate.

Secondly, in accordance with the present invention, positional modifications or repairing of the terminals and the capacitor bodies at the time of mounting of the terminals and the capacitor bodies on the plate is not required to be performed, thus resulting in the remarkably easy mounting operations.

Thirdly, in accordance with the present invention, since the upper portions of the capacitor bodies can be covered by the plate made of synthetic resin, the soldering bit can be prevented from being brought into contact with the capacitor bodies in the case of soldering of the terminals to lead wires, so that heat resistance of the capacitor bodies is improved, thereby preventing the capacitor bodies from being cracked.

Fourthly, in accordance with the present invention, since the capacitor bodies are not subjected to pretinning prior to bonding of the capacitor bodies to the plate, the capacitor bodies can be fed automatically by using a parts feeder, etc. and thus, assembly processes of the capacitor bodies can be reduced in number.

Fifthly, in accordance with the present invention, a number of the capacitor bodies are mounted on the plate and therefore, can be inserted into the chassis at a time, so that a number of the capacitor bodies can be mounted on the chassis efficiently and easily.

Sixthly, in accordance with the present invention, since the through-opening of each of the feedthrough-capacitors and each of the projections are, respectively, formed into the circular and angular cross-sectional shapes, while the through-hole of each of the projections and each of the terminals are, respectively, formed into the circular and angular cross-sectional shapes, each of the projections and each of the terminals can be, respectively, inserted into the through-opening and the through-hole easily and securely. Furthermore, since the capacitor bodies can be prevented from being cracked at the time of insertion thereof into the through-openings, while the space defined between each of projections and the periphery of the through-opening and the space defined between each of the terminals and the periphery of the through-hole act as passages for flux or air at the time of soldering of the capacitor bodies, soldering of the capacitor bodies can be performed with much ease.

Furthermore, in accordance with the present invention, since the plate having a plurality of the feedthrough-capacitors supported thereon is fixedly secured to the grounding terminal strip by the use of at least two fixing protrusions formed on the plate such that the feedthrough-capacitors are mounted on the grounding terminal strip, the plate is secured at a predetermined position of the grounding terminal strip, so that the feedthrough-capacitors are mounted on the grounding terminal strip accurately in position and with much ease.

In addition, in accordance with the present invention, since each of the openings of the grounding terminal strip is formed into an elongated opening, dimensional errors between the plate and the grounding terminal strip or dimensional changes of the plate and the grounding terminal strip due to thermal expansion thereof by heat of the soldering are absorbed by the openings, so that it becomes possible to prevent warpage or deformation of the plate.

Although the present invention has been fully described by way of example with reference to the accompanying drawings, it is to be noted here that various changes and modifications will be apparent to those skilled in the art. Therefore, unless such changes and modifications depart from the scope of the present invention, they should be construed as included therein.

What is claimed is:

1. A feedthrough-capacitor unit having a plurality of feedthrough-capacitors, said unit comprising:
   a plate made of synthetic resin;
   a plurality of projections extending from one face of said plate, a respective first through-hole extending concentrically through each said projection and also extending through a corresponding portion of said plate;

a plurality of terminals, a respective one of said terminals being mounted in each of said first through-holes and extending through its respective through-hole; and a plurality of capacitor bodies each having a second through-hole extending therethrough, each of said capacitor bodies being mounted on a respective one of said projections with an inner surface of its second through-hole mating with an outer surface of its respective projection.

2. A feedthrough-capacitor unit as claimed in claim 1, wherein each of said first through-holes and each of said terminals are, respectively, formed into circular and polygonal cross-sectional shapes such that a first space is defined between each of said terminal and a periphery of each of said first through-hole and/or each of said second through-holes and each of said projections are, respectively, formed into circular and polygonal cross-sectional shapes such that a second space is defined between each of said projections and a periphery of each of said second through-holes.

3. A feedthrough-capacitor unit as claimed in claim 2, further including at least two fixing protrusions formed on said face of said plate, a plurality of outer electrodes each provided in each of said feedthrough-capacitors and a grounding terminal strip, said grounding terminal strip being formed with at least two fixing openings for receiving therein said fixing protrusions, respectively such that said plate is secured to said grounding terminal strip through fitting of said fixing protrusions into said fixing openings, respectively.

4. A feedthrough-capacitor unit as claimed in claim 3, wherein each of said fixing openings is an elongated opening.

5. A feedthrough-capacitor unit as claimed in claim 4, wherein each of said fixing protrusions includes an engaging piece formed on a peripheral face thereof, which is retained by a peripheral edge of each of said fixing openings.

6. A feedthrough-capacitor unit as claimed in claim 3, wherein each of said fixing protrusions includes an engaging piece formed on a peripheral face thereof, which is retained by a peripheral edge of each of said fixing openings.

7. A feedthrough-capacitor unit as claimed in claim 1, further including at least two fixing protrusions formed on said face of said plate, a plurality of outer electrodes each provided in each of said feedthrough-capacitors and a grounding terminal strip, said grounding terminal strip being formed with at least two fixing openings for receiving therein said fixing protrusions, respectively such that said plate is secured to said grounding terminal strip through fitting of said fixing protrusions into said fixing openings, respectively.

8. A feedthrough-capacitor unit as claimed in claim 7, wherein each of said fixing openings is an elongated opening.

9. A feedthrough-capacitor unit as claimed in claim 8, wherein each of said fixing protrusions includes an engaging piece formed on a peripheral face thereof, which is retained by a peripheral edge of said fixing openings.

10. A feedthrough-capacitor unit as claimed in claim 7, wherein each of said fixing protrusions includes an engaging piece formed on a peripheral face thereof, which is retained by a peripheral edge of each of said fixing openings.

* * * * *